(12) United States Patent
Kono et al.

(10) Patent No.: US 9,793,357 B2
(45) Date of Patent: Oct. 17, 2017

(54) SEMICONDUCTOR DEVICE AND METHOD OF MANUFACTURING THE SAME (71) Applicant: Kabushiki Kaisha Toshiba, Minato-ku, Tokyo (JP)

(72) Inventors: Hiroshi Kono, Himeji Hyogo (JP); Kohei Morizuka, Himeji Hyogo (JP); Yoichi Hori, Himeji Hyogo (JP); Atsuko Yamashita, Himeji Hyogo (JP); Tomohiro Nitta, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/070,218

(22) Filed: Mar. 15, 2016

(65) Prior Publication Data

US 2017/0077238 A1    Mar. 16, 2017

(30) Foreign Application Priority Data

Sep. 14, 2015 (JP) ................. 2015-181273

(51) Int. Cl.
*H01L 29/15* (2006.01)
*H01L 29/16* (2006.01)
(Continued)

(52) U.S. Cl.
CPC ...... *H01L 29/1608* (2013.01); *H01L 21/0465* (2013.01); *H01L 21/0485* (2013.01);
(Continued)

(58) Field of Classification Search
CPC ............. H01L 29/1608; H01L 21/0465; H01L 21/0485; H01L 29/0684; H01L 29/0882;
(Continued)

(56) References Cited

U.S. PATENT DOCUMENTS 6,573,534 B1 * 6/2003 Kumar ................ H01L 29/1608
257/328
8,872,193 B2   10/2014 Tega et al.
(Continued)

FOREIGN PATENT DOCUMENTS

| JP | 2013-084990 A | 5/2013 |
| JP | 2013-098316 A | 5/2013 |
| JP | 2013-105856 A | 5/2013 |
| JP | 2013-254789 A | 12/2013 |
| TW | 201104865 A1 | 2/2011 |
| WO | 2015068481 A1 | 5/2015 |

OTHER PUBLICATIONS

Taiwanese Office Action dated Oct. 13, 2016 in counterpart Taiwanese patent Application No. 105105729, along with English translation thereof.

*Primary Examiner* — Yosef Gebreyesus
(74) *Attorney, Agent, or Firm* — White & Case LLP (57) ABSTRACT

A semiconductor device includes first, second, third, and fourth electrodes, a first insulating film, and first, second third, and fourth silicon carbide layers. A first distance between the first electrode and a first interface between the fourth electrode and fourth silicon carbide region is longer than a second distance between the first insulating film and a second interface between the third silicon carbide region and the fourth silicon carbide region. The fourth silicon carbide region is between the third silicon carbide region and the second silicon carbide region in a direction perendicular to the second interface.

16 Claims, 10 Drawing Sheets (51) Int. Cl.

| | |
|---|---|
| *H01L 29/45* | (2006.01) |
| *H01L 29/06* | (2006.01) |
| *H01L 29/40* | (2006.01) |
| *H01L 29/78* | (2006.01) |
| *H01L 29/739* | (2006.01) |
| *H01L 21/04* | (2006.01) |
| *H01L 29/66* | (2006.01) |
| *H01L 29/10* | (2006.01) |
| *H01L 29/08* | (2006.01) |

(52) U.S. Cl.
CPC ...... *H01L 29/0684* (2013.01); *H01L 29/0865* (2013.01); *H01L 29/0882* (2013.01); *H01L 29/1095* (2013.01); *H01L 29/407* (2013.01); *H01L 29/45* (2013.01); *H01L 29/66068* (2013.01); *H01L 29/7395* (2013.01); *H01L 29/7811* (2013.01)

(58) Field of Classification Search
CPC ... H01L 29/1095; H01L 29/407; H01L 29/45; H01L 29/7811; H01L 29/0864; H01L 29/0865; H01L 29/404; H01L 29/66068; H01L 29/7395
See application file for complete search history.

(56) References Cited

U.S. PATENT DOCUMENTS

| | | | |
|---|---|---|---|
| 2010/0032755 A1* | 2/2010 | Benaissa | H01L 21/82381 257/337 |
| 2011/0165764 A1 | 7/2011 | Sasaki et al. | |
| 2012/0007104 A1* | 1/2012 | Wada | H01L 21/0485 257/77 |
| 2012/0037920 A1 | 2/2012 | Treu et al. | |
| 2012/0037922 A1* | 2/2012 | Kono | H01L 21/0465 257/77 |
| 2012/0056201 A1 | 3/2012 | Wada et al. | |
| 2012/0056202 A1 | 3/2012 | Wada et al. | |
| 2012/0061686 A1 | 3/2012 | Nishiguchi et al. | |
| 2012/0061687 A1 | 3/2012 | Harada et al. | |
| 2012/0313112 A1* | 12/2012 | Wada | H01L 29/045 257/77 |
| 2013/0062624 A1* | 3/2013 | Tsuchiya | H01L 29/0839 257/77 |
| 2015/0137145 A1 | 5/2015 | Kono et al. | |
| 2015/0236099 A1* | 8/2015 | Shimizu | H01L 29/1608 257/77 |
| 2015/0279940 A1* | 10/2015 | Yamada | H01L 29/1095 257/77 |
| 2016/0293423 A1 | 10/2016 | Yamada et al. | |

\* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2015-181273, filed on Sep. 14, 2015, the entire contents of which are incorporated herein by reference.

FIELD

Embodiments described herein relate generally to a semiconductor device and a method of manufacturing the same.

BACKGROUND

Semiconductor elements such as switching elements or diodes are used for circuits such as switching power sources or inverters. These semiconductor elements require high breakdown voltage and low on-resistance. Herein, the breakdown voltage and the on-resistance have a trade-off relationship determined by element materials.

Up to now, with the advance of technology development, for main semiconductor elements, low on-resistance near the limit of silicon (Si) as a generally used element material is realized. For further improvement of the breakdown voltage or reduction in on-resistance, element materials are preferably changed. By using a wide-band-gap semiconductor material such as a gallium nitride (GaN)-based semiconductor material or a silicon carbide (SiC)-based semiconductor material as a switching element material, the trade-off relationship can be improved, so that the high breakdown voltage or low on-resistance of the elements can be drastically implemented.

DETAILED DESCRIPTION

First Embodiment

According to an aspect of the present invention, a provided semiconductor device includes: a first electrode; a second electrode; a third electrode provided between the first electrode and the second electrode; a first insulating film provided between the third electrode and the second electrode; a silicon carbide layer provided between the first insulating film and the second electrode; a first silicon carbide region provided between the third electrode and the second electrode, the first silicon carbide region being provided in the silicon carbide layer; a second silicon carbide region provided between the third electrode and the first silicon carbide region, the second silicon carbide region being provided in the silicon carbide layer; a third silicon carbide region provided between the third electrode and the second silicon carbide region, the third silicon carbide region being provided in the silicon carbide layer; a fourth silicon carbide region provided between the third silicon carbide region and the second silicon carbide region, the fourth silicon carbide region being provided in the silicon carbide layer; and a fourth electrode provided between the first electrode and the fourth silicon carbide region, the fourth electrode being provided laterally adjacent to the third silicon carbide region, the fourth electrode containing a metal silicide, a first distance between the first electrode and a first interface between the fourth electrode and the fourth silicon carbide region being longer than a second distance between the first electrode and a second interface between the third silicon carbide region and the fourth silicon carbide region, and a third distance between a third interface between the fourth electrode and the first electrode and a fourth interface between the third silicon carbide region and the fourth silicon carbide region being shorter than a fourth distance between the fourth interface and a fifth interface between the third silicon carbide region and the first electrode.

According to another aspect of the present invention, a provided semiconductor device includes: a silicon con carbide layer having a first plane and a second plane provided opposite to the first plane; an insulating film provided on the first plane; a first electrode provided on the insulating film; a second electrode provided on the second plane; a first-conductivity-type first silicon carbide region provided in the silicon carbide layer, a portion of the first silicon carbide region being provided on the first plane; a second-conductivity-type second silicon carbide region provided in the first silicon carbide region, a portion of the second silicon carbide region being provided on the first plane; a first-conductivity-type third silicon carbide region provided in the second silicon carbide region, a portion of the third silicon carbide region being provided on the first plane; a second-conductivity-type fourth silicon carbide region provided under the third silicon carbide region in the second silicon carbide region, a third plane being provided between the third silicon carbide region and the fourth silicon carbide region; and a third electrode provided to include the first plane and the third plane in the second silicon carbide region, a thickness of the third electrode being larger than a distance between a portion of the first plane included in the third electrode and a portion of the third plane included in the third electrode, the third electrode containing a metal silicide, wherein the first electrode is a gate electrode 34 and the third electrode is a contact electrode 30.

Hereinafter, embodiments of the present invention will be described with reference to the drawings.

In the specification, the same or similar components are denoted by the same reference numerals, and redundant description thereof may be omitted.

In the specification, notations of n$^+$, n, and n$^-$ and notations of p$^+$, p, and p$^-$ represent relative levels of impurity concentrations of respective conductivity types. Namely, it is represented that the concentration of n-type impurities of n$^+$ relatively higher than that of n, and the concentration of n-type impurities of n$^-$ is relatively lower than that of n. In addition, it is represented that the concentration of p-type impurities of p$^+$ relatively higher than that of p, and the concentration of p-type impurities of p$^-$ is relatively lower than that of p. In addition, in some cases, n$^+$ and n$^-$ are simply referred to as an n-type, and p$^+$ and p$^-$ are simply referred to as a p-type. Hereinafter, in the description, the n-type is referred to as a first conductivity type, and the p-type is referred to as a second conductivity type.

In the specification, in order to indicate positional relationship of components and the like, the up direction of a figure is denoted by "up", and the down direction of the figure is denoted by "down". In the specification, the concepts of "up" and "down" are not necessarily the notations indicating the relationship with respect to the direction of gravity.

Figure 1A:
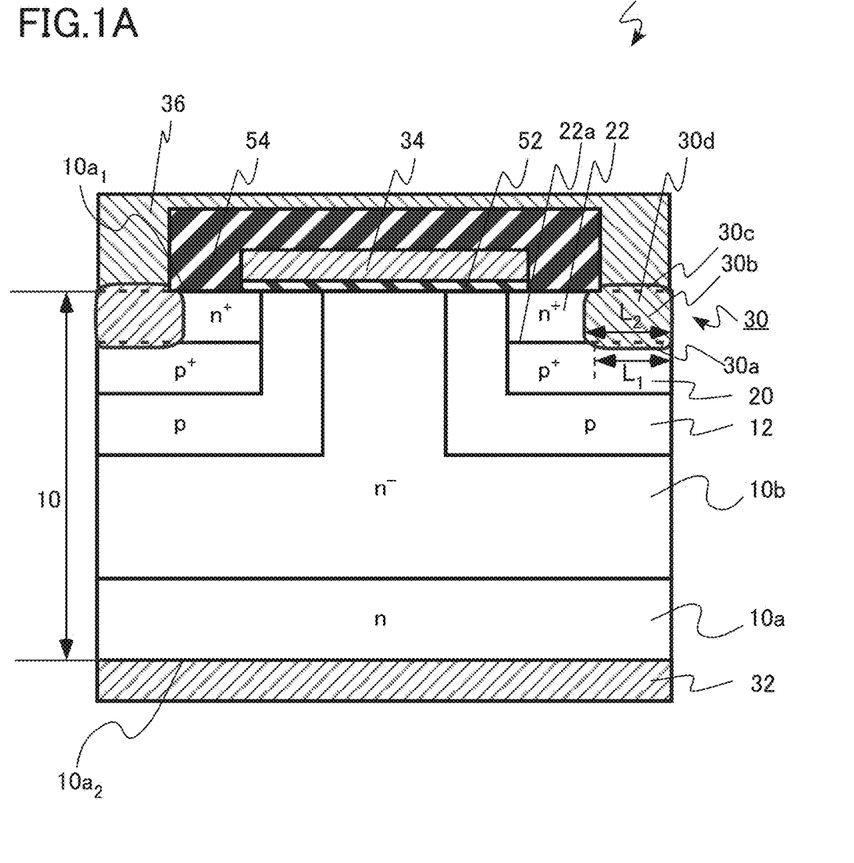
FIGS. 1A to 1C are schematic cross-sectional diagrams of a semiconductor device according to a first embodiment.

FIG. 1A is a schematic cross-sectional diagram of the semiconductor device according to the embodiment. The semiconductor device according to the embodiment is a double implantation metal oxide semiconductor field effect transistor (DI MOSFET).

The semiconductor device 100 includes a silicon carbide layer 10, a third electrode 34, a second electrode 32, a fourth electrode 30, a first electrode 36, a first insulating film 52, and a second insulating film 54. The silicon carbide layer 10 is configured to include a first silicon carbide region 10$b$, a second silicon carbide region 12, a third silicon carbide region 22, a fourth silicon carbide region 20, and a fifth silicon carbide region 10$a$.

The silicon carbide layer 10 is provided between the first insulating film 52 and the second electrode 32. The silicon carbide layer 10 has a first plane 10$a_1$ and a second plane 10$a_2$ provided opposite to the first plane 10$a_1$. In a case where the silicon carbide layer 10 is 4H-SiC, the plane index of the first plane 10$a_1$ is (0001). In addition, in a case where the silicon carbide layer 10 is 3C-SiC, the plane index of the first plane 10$a_1$ is (001). In addition, in a case where the silicon carbide layer 10 is 6H-SiC, the plane index of the first plane 10$a_1$ is (0001). In addition, in the specification, it is assumed that a case where the plane index is expressed by (0001) or (001) includes a case where off angle of 10 degrees or less is provided for the purpose of obtaining a silicon carbide layer having a good quality. The plane index of the first plane can be measured by X-ray diffraction (XRD).

The first insulating film 52 is provided on the first plane 10$a_1$. In other words, the first insulating film 52 is provided between the silicon carbide layer 10 and the third electrode 34, in other words, the first insulating film 52 is provided between the third electrode 34 and the second electrode 32. The first insulating film 52 is a gate insulating film. The first insulating film is, for example, a silicon oxide film or a high-k film.

The third electrode 31 is provided on the first insulating film 52. In other words, the third electrode 34 is provided between the first electrode 36 and the second electrode 32. The third electrode 34 is a gate electrode. The third electrode 34 includes, for example, polycrystal line silicon doped with impurities.

The first silicon carbide region 10$b$ is provided in the silicon carbide layer 10, and a portion of the first silicon carbide region is provided on the first plane 10$a_1$. In other words, the first silicon carbide region 10$b$ is provided between the third electrode 34 and the second electrode 32. The first silicon carbide region 10$b$ is a drift region. The first silicon carbide region 10$b$ contains, for example, n-type impurities of $10^{14}$ cm$^{-3}$ or more and $3 \times 10^{16}$ cm$^{-3}$ or less. The impurity concentration of the first silicon carbide region 10$b$ is lower than the impurity concentration of the fifth silicon carbide region 10$a$.

The second silicon carbide region 12 is provided in the first silicon carbide region 10$b$, and a portion of the second silicon carbide region is provided on the first plane 10$a_1$. In other words, the second silicon carbide region 12 is provided between the third electrode 34 and the first silicon carbide region 10$b$, and the second silicon carbide region 12 is provided in the silicon carbide layer 10. The second silicon carbide region 12 is a well region. The second silicon carbide region 12 functions as a channel region of the MOSFET. The thickness of the second silicon carbide region 12 is, for example, about 0.6 μm. The second silicon carbide region 12 contains, for example, p-type impurities with a peak concentration of $10^{18}$ cm$^{-3}$ or more and $10^{19}$ cm$^{-3}$ or less. The p-type impurity is, for example, Al (aluminum) B (boron), Ga (gallium), or In (indium).

The third silicon carbide region 22 is provided in the second silicon carbide region 12, and a portion of the third silicon carbide region is provided on the first plane 10$a_1$. In other words, the third silicon carbide region 22 is provided between the third electrode 34 and the second silicon carbide region 12, and the third silicon con carbide region 22 is provided in the silicon carbide layer 10. The third silicon carbide region 22 functions as a source region of the MOSFET. The thickness of the third silicon carbide region 22 is, for example, about 0.1 μm and is smaller than that of the second silicon carbide region 12. The third silicon carbide region 22 contains, for example, n-type impurities of $1 \times 10^{19}$ cm$^{-3}$ or more and $1 \times 10^{20}$ cm$^{-3}$ or less.

The fourth silicon carbide region 20 is provided under the third silicon carbide region 22 in the second silicon carbide region 12. A third plane 22$a$ is provided between the third silicon carbide region 22 and the fourth silicon carbide region 20. In other words, the fourth silicon carbide region 20 is provided between the third silicon carbide region 22 and the second silicon carbide region 12, and the fourth silicon carbide region 20 is provided in the silicon carbide layer 10. The fourth silicon carbide region 20 is a contact region. The fourth silicon carbide region 20 is used to reduce the contact resistance between the second silicon carbide region 12 and the fourth electrode 30. The thickness of the fourth silicon carbide region 20 is, for example, about 0.2 μm and is smaller than that of the second silicon carbide region 12. The fourth silicon carbide region 20 contains, for example, p-type impurities of $1 \times 10^{19}$ cm$^{-3}$ or more and $1 \times 10^{20}$ cm$^{-3}$ or less.

The fifth silicon carbide region 10$a$ is provided in the silicon carbide layer 10 between the first silicon carbide region 10$b$ and the second electrode 32. The fifth silicon carbide region 10$a$ is, for example, an n-type 4H-SiC containing n-type impurities of $1 \times 10^{19}$ cm$^{-3}$ or more and $1 \times 10^{20}$ cm$^{-3}$ or less. The n-type impurity is, for example, N (nitrogen), As (arsenic), P (phosphorus), or Sb (antimony).

The fourth electrode 30 is provided in the second silicon carbide region 12 to include the first plane $10a_1$ and the third plane 22a. In other words, the fourth electrode 30 provided between the first electrode 36 and the fourth silicon carbide region 20, and the fourth electrode 30 is provided laterally adjacent to the third silicon carbide region 22. The fourth electrode 30 is a contact electrode. The fourth electrode 30 includes a first portion 30a provided under the third plane 22a, a second portion 30b provided between the third plane 22a and the first plane $10a_1$, and a third portion 30c provided above the third plane 22b. For this reason, the thickness of the fourth electrode 30 is larger than the distance between the portion of the first plane $10a_1$ included in the fourth electrode 30 and the portion of the third plane 22a included in the fourth electrode 30. In other words, the thickness of the fourth electrode 30 is larger than the thickness of the third silicon carbide region 22. Herein, the third plane 22a is a plane extending from the portion between the fourth silicon carbide region 20 and the third silicon carbide region 22 to the fourth electrode 30. In other words, a first distance between the first electrode 36 and a first interface between the fourth electrode 30 and the fourth silicon carbide region 20 is longer than a second distance between the first electrode 36 and a second interface between the third silicon carbide region 22 and the fourth silicon carbide region 20, and a third distance between a third interface between the fourth electrode 30 and the first electrode 36 and a fourth interface between the third silicon carbide region 22 and the fourth silicon carbide region 20 being shorter than a fourth distance between the fourth interface and a fifth interface between the third silicon carbide region 22 and the first electrode 36.

In addition, the length $L_1$ of the first portion 30a in a fourth plane 30d is smaller than the length $l_2$ of the second portion 30b in the fourth plane 30d. Here, the fourth plane 30d is perpendicular to the first plane 10 $a_1$, and $L_1$ and $L_2$ are taken so that they are parallel to the third plane 22a.

Figure 1B:
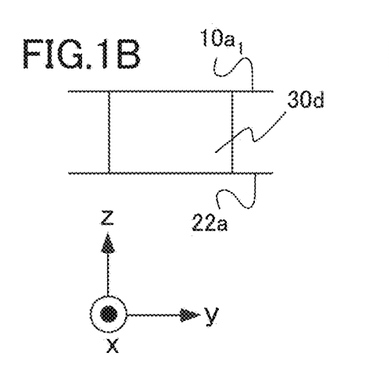
Figure 1C:
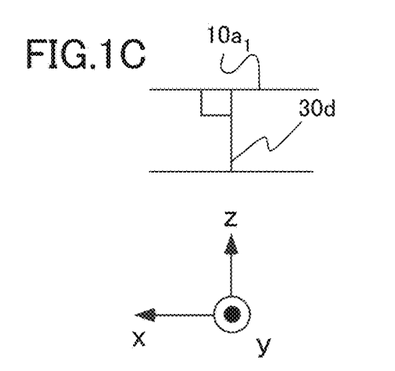

FIGS. 1B and 1C are schematic diagrams illustrating a relationship between the first plane $10a_1$ and the fourth plane 30d. An X-axis direction, a Y-axis direction which is perpendicular to the X-axis direction, and a Z-axis direction which is perpendicular to the X-axis direction and the Y-axis direction are defined. In a case where the first plane $10a_1$ is perpendicular to the Z-axis, that is, a plane parallel to the KY plane, the fourth plane 30d is perpendicular to the X-axis, that is, a plane parallel to the YZ plane. For this reason, the fourth plane 30d is perpendicular to the first plane $10a_1$.

The thickness of the fourth electrode 30, the distance between the portion of the first plane $10a_1$ included in the fourth electrode 30 and the portion of the third plane 22a included in the fourth electrode 30, and the above-described $L_1$ and $L_2$ can be measured by observing the cross section of the semiconductor device 100 by using, for example, a transmission electron microscope (TEM)—energy dispersive X-ray (EDX) spectroscopy or by performing element analysis on the cross section.

The fourth electrode 30 contains a metal silicide. The metal silicide is, for example, a titanium silicide, an aluminum silicide, a nickel silicide, a cobalt silicide, a tantalum silicide, a tungsten silicide, or a hafnium silicide. In order to reduce the contact resistance, the nickel silicide is particularly preferred.

The second electrode 32 is provided on the second plane $10a_2$. The second electrode 32 and the first plane $10a_2$ may be in direct contact with each other or may be in indirect contact with each other through an intermediate layer or the like. The second electrode 32 is electrically connected to the silicon carbide layer 10. The second electrode 32 contains a metal silicide. In order to reduce the contact resistance, the nickel silicide is particularly preferred.

The second insulating film 54 is provided at the side of and above the first insulating film 52 and the third electrode 34. In other words, the second insulating film 54 is provided between the third electrode 34 or the first insulating film 52, and the first electrode 36. The second insulating film 54 is electrically insulated from the fourth electrode 30 and the third electrode 34.

The first electrode 36 is a source electrode. The first electrode 36 is electrically connected to the fourth electrode 30. The first electrode 36 is configured to have a stacked structure of, for example, Ti (titanium)/Al (aluminum) and is formed by a well-known process. In addition, a barrier metal having a stacked structure of Ti/TiN (titanium nitride)/Al may be provided between the first electrode 36 and the fourth electrode 30. In addition, a passivation film made of SiN silicon nitride) may be provided in the upper portion of the first electrode 36.

Next, function and effect of the semiconductor device 100 according to the embodiment will be described.

The first portion 30a and the second portion 30b are provided, so that the thickness of the fourth electrode is larger than the distance between the first plane $10a_1$ and the third plane 22a. Since the first portion 30a is provided, the contact resistance between the fourth electrode 30 and the fourth silicon carbide region. 20 is reduced, compared to the case where the first portion 30a is not provided. On the other hand, due to the second portion 30b, the contact resistance between the fourth electrode 30 and the third silicon carbide region 22 is reduced. Therefore, the fourth electrode 30 includes both of the first portion 30a and the second portion 30b, so that contact resistance between the fourth electrode 30 and the fourth silicon carbide region 20 and contact resistance between the fourth electrode 30 and the third silicon carbide region 22 are reduced.

The length $L_1$ is smaller than the length $L_2$, that is, the length $L_2$ is larger than the length $L_1$, which indicates that the fourth electrode 30 was formed in the region where the third silicon carbide region 22 had been provided before. Therefore, the contact resistance between the fourth electrode 30 and the third silicon carbide region 22 can be further reduced.

The fourth electrode 30 includes the third portion 30c, so that the thickness is much larger than the distance between the first plane $10a_1$ and the third plane 22a. Therefore, a margin in the manufacturing of the fourth electrode 30 can be improved.

Next, a method of manufacturing the semiconductor device 100 according to the embodiment will be described.

Figure 2:
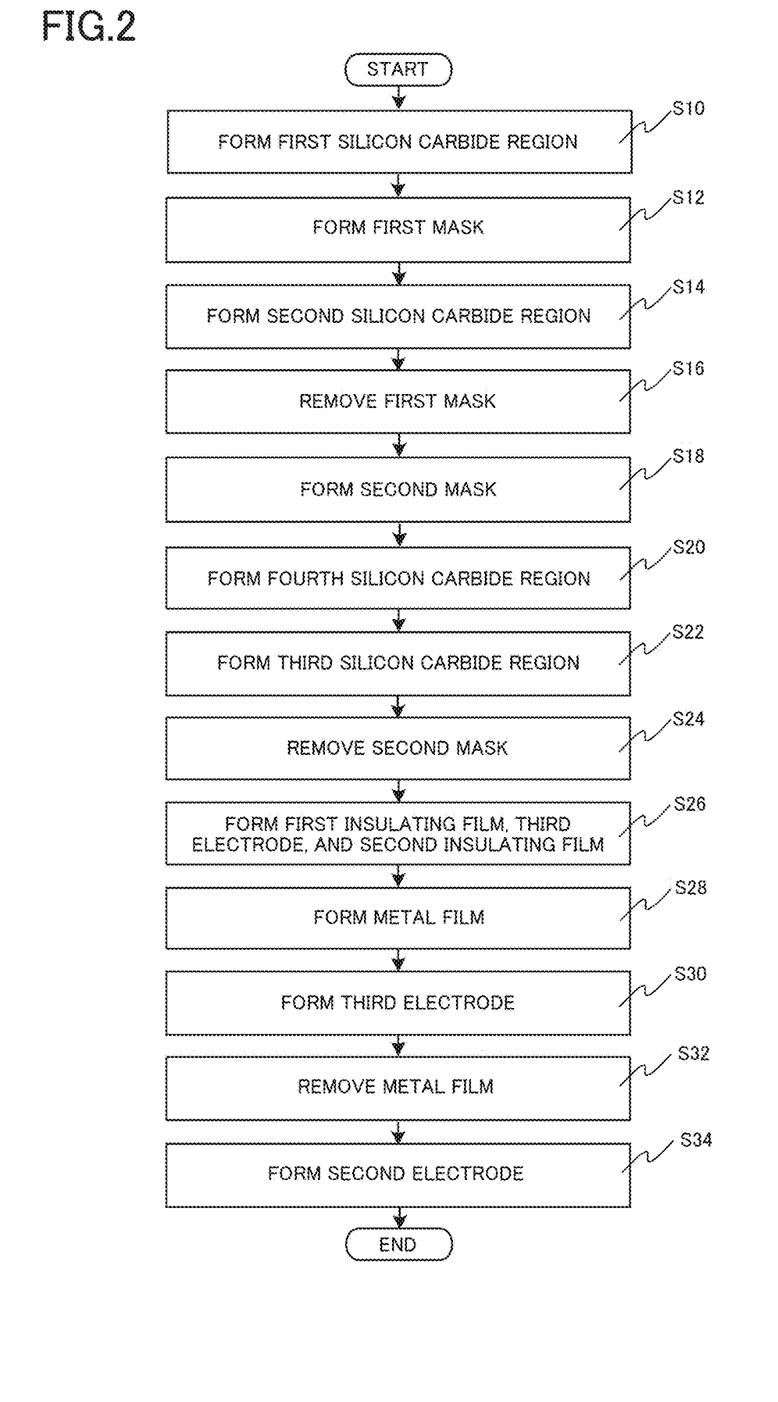
FIG. 2 is a flowchart illustrating a method of manufacturing the semiconductor device according to the first embodiment.

FIG. 2 is a flowchart illustrating the method of manufacturing the semiconductor device according to the embodiment. FIGS. 3 to 8 are schematic cross-sectional diagrams of the semiconductor device during the manufacturing in the method of manufacturing the semiconductor device according to the embodiment.

The method of manufacturing the semiconductor device 100 according to the embodiment includes forming the n-type first silicon carbide region 10b on the n-type fifth silicon carbide region 10a, forming the first mask 60 on the first silicon carbide region 10b, forming the p-type second silicon carbide region (silicon carbide layer) 12 by performing ion implantation of p-type impurities on the first silicon carbide region 10b by using the first mask 60, removing the first mask 60, forming the second mask 62 on the second silicon carbide region 12 and on the first silicon carbide region 10b, forming the p-type fourth silicon carbide region 20 by performing ion implantation of p-type impurities on the second silicon carbide region 12 by using the second mask 62, forming the n-type third silicon carbide region 22 including the third plane 22a being in contact with the fourth silicon carbide region 20 and the second plane 22b provided at the side opposite to the third plane by performing ion implantation of n-type impurities on the fourth silicon carbide region 20 by using the second mask 62, removing the second mask 62, activating the ion-implanted impurities by thermal treatment, forming the first insulating film 52 on the first silicon carbide region 10b, on the second silicon carbide region 12, and on the third silicon carbide region 22, forming the third electrode 34 on the first insulating film 52, forming the second insulating film 54 at the side of and above the first insulating film 52 and the third electrode 34 on the first silicon carbide region 10b and the fourth electrode 30, forming the metal layer 70 containing a metal on the third silicon carbide region 22 and the second insulating film 54, performing thermal treatment on the second silicon carbide region 12 where the metal layer 70 is formed, forming the fourth electrode having a thickness larger than the distance between the third plane and the second plane and containing a metal silicide at the side of the third silicon carbide region 22 on the fourth silicon carbide region 20, and removing the metal film 70.

The method of manufacturing the semiconductor device 100 according to another embodiment includes forming a second-conductivity-type first silicon carbide region by performing ion implantation of second-conductivity-type impurities on a first-conductivity-type second silicon carbide region provided in a silicon carbide layer having a first plane and a second plane provided opposite to the first plane, a portion of the second silicon carbide region being provided on the first plane; forming a second-conductivity-type third silicon carbide region by performing ion implantation of second-conductivity-type impurities on the first silicon carbide region; forming a first-conductivity-type fourth silicon carbide region by performing ion implantation of first-conductivity-type impurities on the first silicon carbide region, a third plane being formed between the fourth silicon carbide region and the third silicon carbide region; forming a metal layer containing a metal on the fourth silicon carbide region; and forming a first electrode by performing thermal treatment on the silicon carbide layer with the metal layer being formed, the first electrode being provided to include the first plane and the third plane within the first silicon carbide region, a thickness of the first electrode being larger than a distance between a portion of the first plane included in the first electrode and a portion of the third plane included in the first electrode, the first electrode containing a metal silicide, wherein the first silicon carbide region is the well region 12, the second silicon carbide region is the drift region 10b, the third silicon carbide region is the contact region 20, the fourth silicon carbide region is the source region 22, and the first electrode is the contact electrode 30.

First, the n-type fifth silicon carbide region 10a is prepared.

Figure 3:
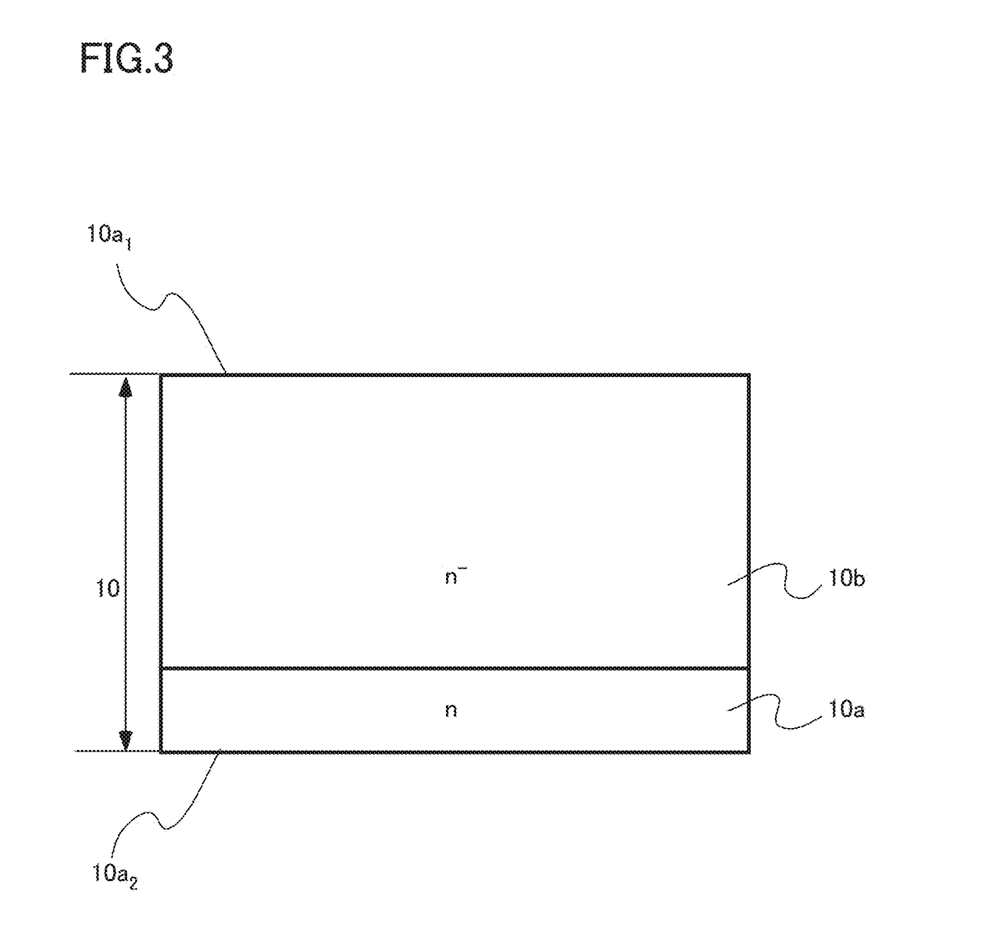
FIG. 3 is a schematic cross-sectional diagram of the semiconductor device during the manufacturing in the method of manufacturing the semiconductor device according to the first embodiment.

Next, as illustrated in FIG. 3, the n-type first silicon carbide region 10b is formed on the n-type fifth silicon carbide region 10a by, for example, an epitaxial growth method (S10).

Next, the first mask 60 is formed on the first silicon carbide region 10b by using, for example, photoresist (S12).

Figure 4:
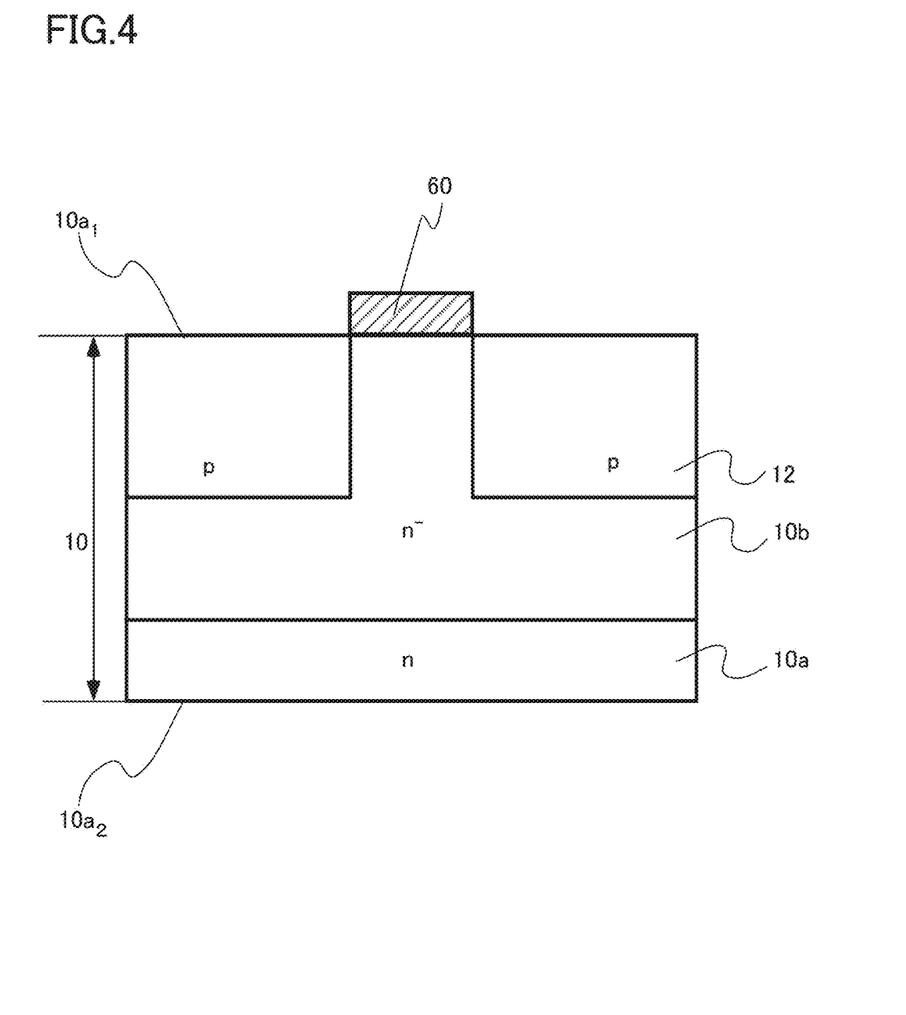
FIG. 4 is a schematic cross-sectional diagram of the semiconductor device during the manufacturing in the method of manufacturing the semiconductor device according to the first embodiment.

Next, as illustrated in FIG. 4, the p-type second silicon carbide region 12 is formed by performing ion implantation of p-type impurities on the first silicon con carbide region 10b by using the first mask 60 (S14).

Next, the first mask 60 is removed (S16).

Next, the second mask 62 is formed on the second silicon carbide region 12 and on the first silicon carbide region 10b (S18). Here, the second mask may be formed without removing the first mask 60.

Figure 5:
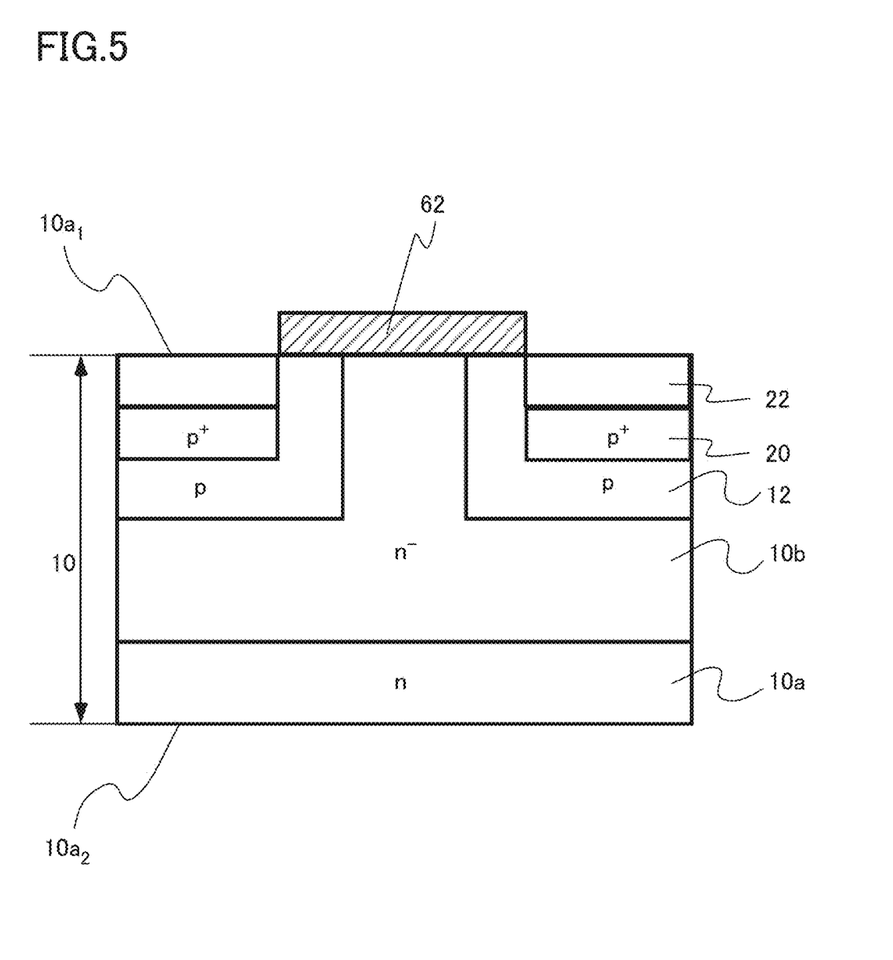
FIG. 5 is a schematic cross-sectional diagram of the semiconductor device during the manufacturing in the method of manufacturing the semiconductor device according to the first embodiment.

Next, as illustrated in FIG. 5, the p-type fourth silicon carbide region 20 is formed by performing ion implantation of p-type impurities on the second silicon carbide region 12 by using the second mask 62 (S20).

Figure 6:
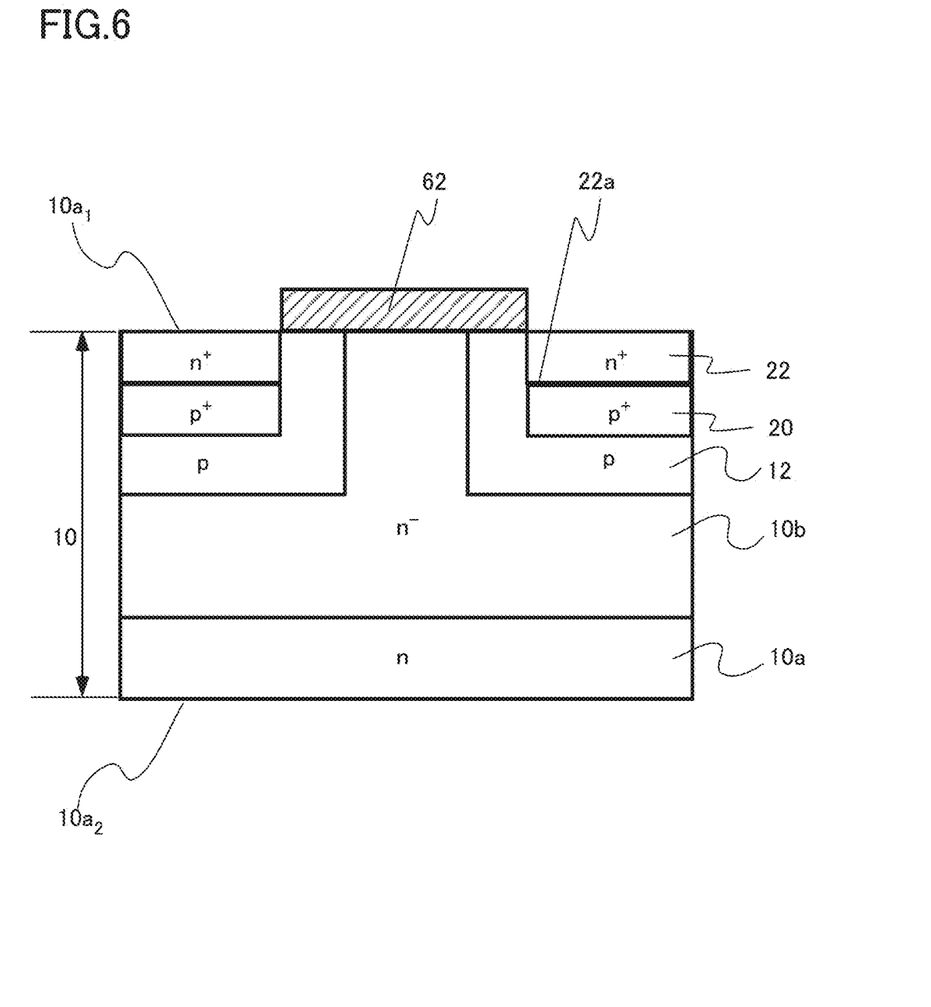
FIG. 6 is a schematic cross-sectional diagram of the semiconductor device during the manufacturing in the method of manufacturing the semiconductor device according to the first embodiment.

Next, as illustrated in FIG. 6, the n-type third silicon carbide region 22 having the third plane being in contact with the fourth silicon carbide region and the first plane provided at the side opposite to the third plane is formed by performing ion implantation of the n-type impurities on the fourth silicon carbide region by using the second mask 62 (S22). Herein, the thickness of the third silicon carbide region 22 is preferably 100 nm or less. Here, the n-type third silicon con carbide region 22 may be formed by performing ion implantation of n-type impurities, and after that, the p-type fourth silicon carbide region 20 may be formed by performing ion implantation of p-type impurities.

Here, the formation of the fourth silicon carbide region 20 and the formation of the third silicon carbide region 22 may be performed by using respective different masks without performing by using the second mask 62. However, if the formation of the fourth silicon carbide region 20 and the formation of the third silicon carbide region 22 are performed by using the second mask 62, the manufacturing process can be simplified.

Next, the second mask 62 is removed (S24). After that, the ion-implanted impurities are activated by thermal treatment of, for example, about 1600° C. Next, the first insulating film 52 is formed on the first silicon carbide region 10b, on the second silicon carbide region 12, and on the third silicon carbide region 22. Next, the third electrode 34 is formed on the first insulating film 52. Next, the second insulating film 54 is formed at the side of and above the first insulating film 52 and the third electrode 34 (S26). Next, a mask (not shown) is formed, and a portion of the second insulating film 54 is removed by a reactive ion etching (RIE) method or the like, so that the contact region is formed. The mask (not shown) is removed.

Figure 7:
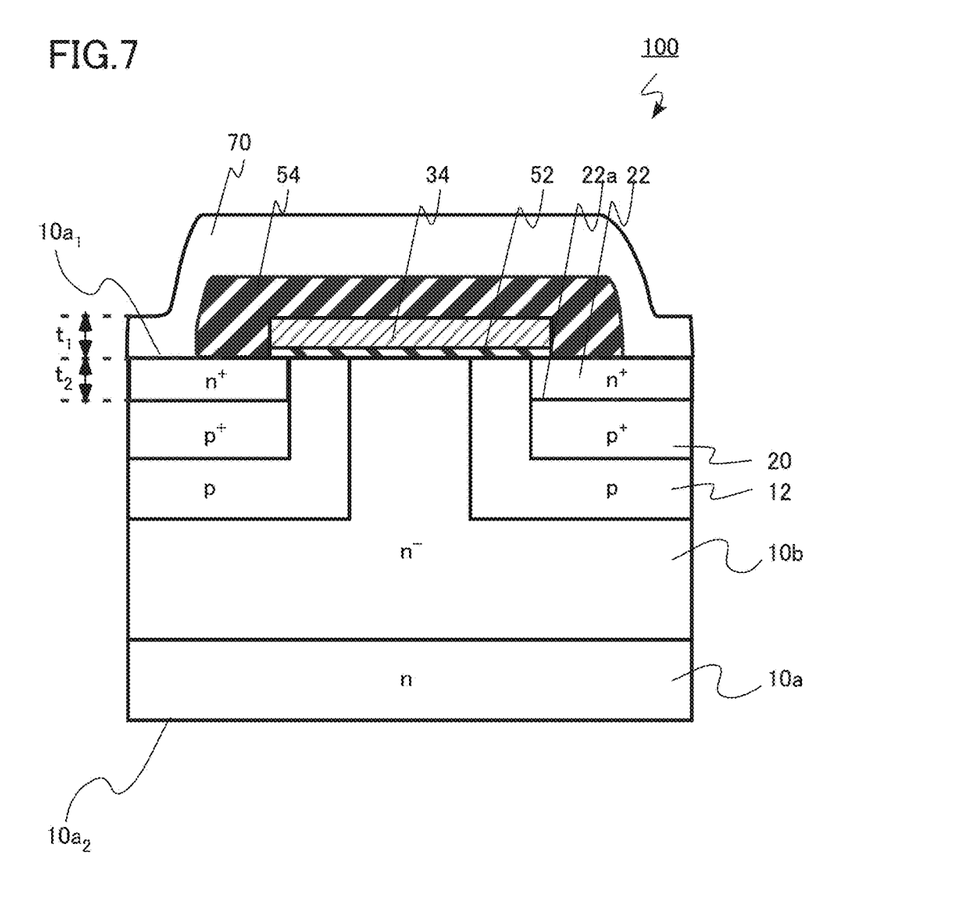
FIG. 7 is a schematic cross-sectional diagram of the semiconductor device during the manufacturing in the method of manufacturing the semiconductor device according to the first embodiment.

Next, as illustrated in FIG. 7, the metal film 70 containing a metal is formed on the third silicon carbide region. 22 and the second insulating film 54 (S28). Herein, the thickness $t_1$ of the metal layer 70 is preferably 90 nm or more and 150 nm or less. In addition, the ratio of the thickness $t_1$ of the metal layer 70 and the thickness $t_2$ of the third silicon carbide region 22 is preferably 1 or more and 2 or less, that is, $1 \leq t_1/t_2 \leq 2$.

Figure 8:
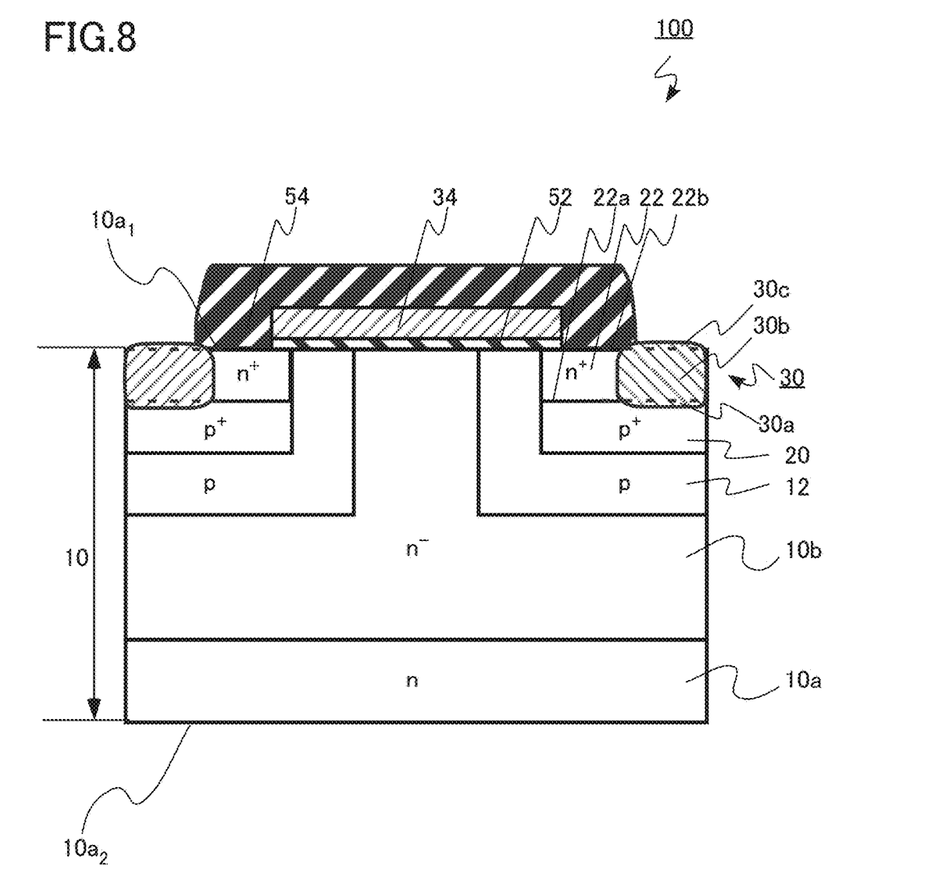
FIG. 8 is a schematic cross-sectional diagram of the semiconductor device during the manufacturing in the method of manufacturing the semiconductor device according to the first embodiment.

Next, as illustrated in FIG. 8, by performing thermal treatment on the second silicon carbide region 12 where the metal layer 70 is formed, for example, at 1000° C. for 5 minutes, the fourth electrode 30, which has a thickness larger than the distance between the third plane and the first plane, and which contains a metal silicide, is formed at the side of the third silicon carbide region 22 and on the fourth silicon carbide region 20 (S30). Herein, the formed fourth electrode 30 includes the first portion 30a and the second portion 30b. The fourth electrode 30 may further include the third portion 30c.

Next, the metal film 70 is removed by using a chemical solution such as sulfuric acid hydrogen peroxide mixture (S32). Next, the first electrode 36 is formed on the fourth electrode 30. Next, the second electrode 32 is formed to be in contact with the second plane $10a_2$ of the fifth silicon carbide region. 10a (S34), so that the semiconductor device 100 according to the embodiment is obtained. In addition, the third portion 30c may be removed by a reverse sputtering method or the like.

Next, function and effect of the method of manufacturing the semiconductor device 100 according to the embodiment will be described.

For the scaling-down of the semiconductor device, the formation of the electrodes having low contact resistance with respect to the source region and the well region is preferred. A comparative example of forming a source region by performing ion implantation of n-type impurities on a well source, forming a trench penetrating the source region, forming a contact region by performing ion implantation of p-type impurities into a lower portion of the trench, and forming electrodes by forming metals such as nickel on the sidewall and bottom of the trench is considered.

In the comparative example, after the trench is formed by performing ion implantation of n-type impurities, ion implantation of p-type impurities is performed again. For this reason, the manufacturing process is complicated.

In addition, in a case where the trench is formed, the trench needs to penetrate the source region. For this reason, depth control for the trench becomes an important, difficult manufacturing process.

A manufacturing method of performing ion implantation of n-type impurities and p-type impurities and, after that, forming the trench may also be employed. However, control of location for trench formation is difficult because the control needs to be performed by alignment control for a wafer.

In addition, thickness control for the metal such as nickel formed on the sidewall of the trench is important. If the thickness of the metal such as nickel is too small, no electrode is formed. On the other hand, if the thickness is to large, the reaction between the source region and the nickel excessively proceeds during the subsequent thermal treatment, so that there is a risk that the source region is lost.

In addition, in a case where a metal film is formed on the sidewall of the trench by sputtering or the like, since a thin metal film is generally formed on the sidewall of the trench, it is difficult to form a metal film having an appropriate thickness.

In the method of manufacturing the semiconductor device 100 according to the embodiment, without forming the trench, the fourth silicon carbide region 20, the third silicon carbide region 22, and the metal film 70 are formed, and the fourth electrode 30 containing a metal silicide is formed by performing thermal treatment. If the fifth silicon carbide region 10a is 4H-SiC or 6H-SiC because the plane orientation of the third plane 22a is (0001) the plane orientation in the direction perpendicular to the third plane 22a includes (1-100) or (11-20). The growth rate of the metal silicide in [1-100] or [11-20] is higher than that in [0001]. For this reason, the length $L_1$ of the first portion 30a in a fourth plane 30d is smaller than the length $l_2$ of the second portion 30b in the fourth plane 30d. As a result, the contact resistance between the fourth electrode 30 and the third silicon carbide region 22 is reduced, so that sidewall contact is formed to be stable.

On the other hand, the formation rate of the metal silicide in the p-type fourth silicon carbide region 20 is low. For this reason, the volume of the first portion formed under the third plane is much smaller than the volume of the second portion. Therefore, the risk that the metal silicide is formed in the entire fourth silicon carbide region becomes lower. Consequently, the manufacturing method according to the embodiment does becomes not a difficult manufacturing process like the depth control for the trench but an easy manufacturing process in the case of forming the above-described trench.

Undesired influence of the n-type impurities during the ion implantation of p-type impurities can be removed by the method of forming the third silicon carbide region 22 by performing ion implantation of n-type impurities after forming the fourth silicon carbide region 20 by performing ion implantation of p-type impurities, than the method of forming the fourth silicon carbide region 20 by performing ion implantation of p-type impurities after forming the third silicon carbide region 22 by performing ion implantation of p-type impurities.

The formation of the fourth silicon carbide region 20 and the formation of the third silicon carbide region 22 are performed by using the same second mask 62, so that the fourth silicon carbide region 20 and the third silicon carbide region 22 can be formed without performing alignment (in a self-alignment manner).

In a case where the ratio of the thickness $t_1$ of the metal layer 70 and the thickness $t_2$ of the third silicon carbide region is less than 1, that is, $t_1/t_2<1$ or in a case where the thickness $t_1$ is smaller than 90 nm, the thickness of the metal film 70 is too small, so that the fourth electrode 30 having a sufficient volume is not formed. Therefore, there is a risk that the contact resistance with respect to the fourth silicon carbide region 20 or the third silicon carbide region 22 may be increased. On the other hand, in a case where the ratio of the thickness $t_1$ of the metal layer 70 and the thickness $t_2$ of the third silicon carbide region is more than 2, that is, $t_1/t_2>2$ or in a case where the thickness $t_1$ is larger than 150 nm, the thickness of the metal film 70 is too large, so that the reaction between the metal film 70 and the third silicon carbide region 22 excessively proceeds. Therefore, there is a risk that the third silicon carbide region 22 may be too small and, thus, short-circuit occurs between a gate and a source.

The thickness of the third silicon carbide region 22 is 100 nm or less, so that the reaction with the metal film 70 sufficiently proceeds, and thus, the metal silicide can be appropriately formed. If the thickness is larger than 100 nm, there is a risk that the reaction with the metal film 70 may not sufficiently proceed.

In addition, the plurality of semiconductor devices according to the embodiment is disposed at an interval of 5 μm or less, so that low-resistance semiconductor devices are provided.

Heretofore, according to the semiconductor devices according to the embodiments, it is possible to provide semiconductor devices having electrodes having low contact resistance.

Second Embodiment

A semiconductor device according to the embodiment is different from the semiconductor device according to the first embodiment in terms that the semiconductor device is a trench-type MOSFET. Herein, the redundant configurations with respect to the first embodiment are omitted in description.

Figure 9:
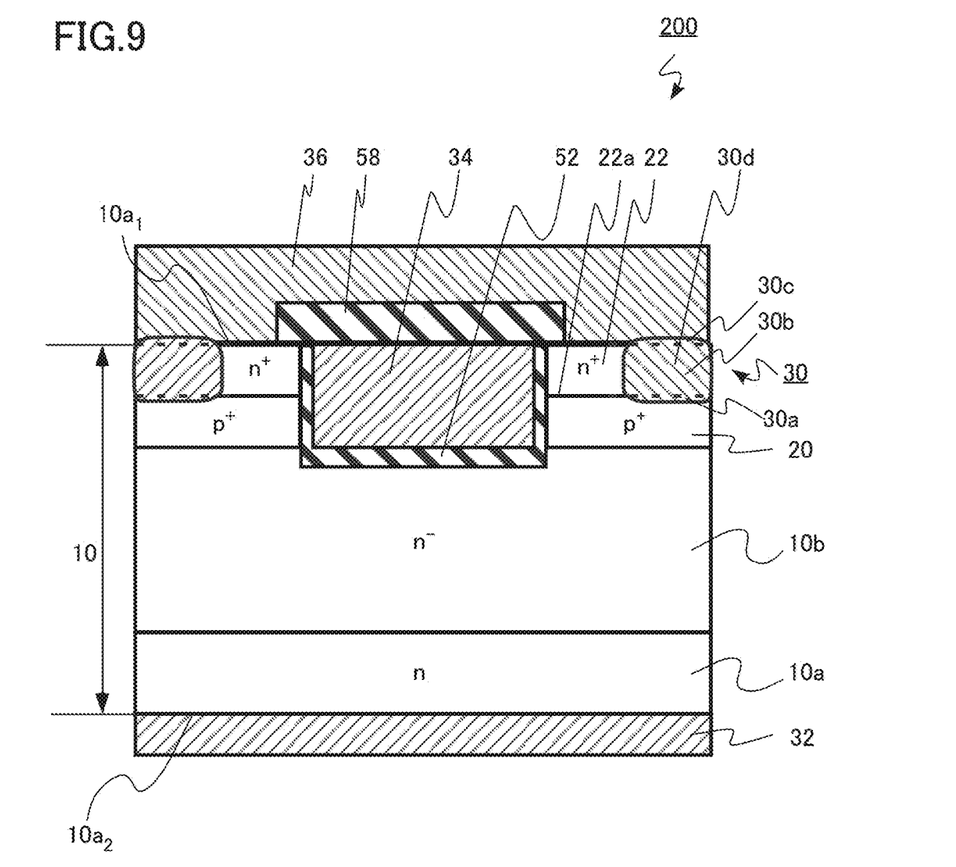
FIG. 9 is schematic cross-sectional diagram of a semiconductor device according to a second embodiment.

FIG. 9 is a schematic cross-sectional diagram of a semiconductor device 200 according to the embodiment. In the semiconductor device 200 according to the embodiment, the fourth silicon carbide region 20 functions as a contact region as well as a well region. A fourth insulating film made of, for example, a silicon oxide is provided between a first electrode 36 and a third electrode 34.

In the semiconductor device according to the embodiment, it is also possible to provide a semiconductor device including electrodes having low contact resistance.

Third Embodiment

A semiconductor device according to the embodiment is different from the semiconductor devices according to the first and second embodiments in terms that the semiconductor device is an insulated gate bipolar transistor (IGBT). Herein, the redundant configurations with respect to the first and second embodiments are omitted in description.

Figure 10:
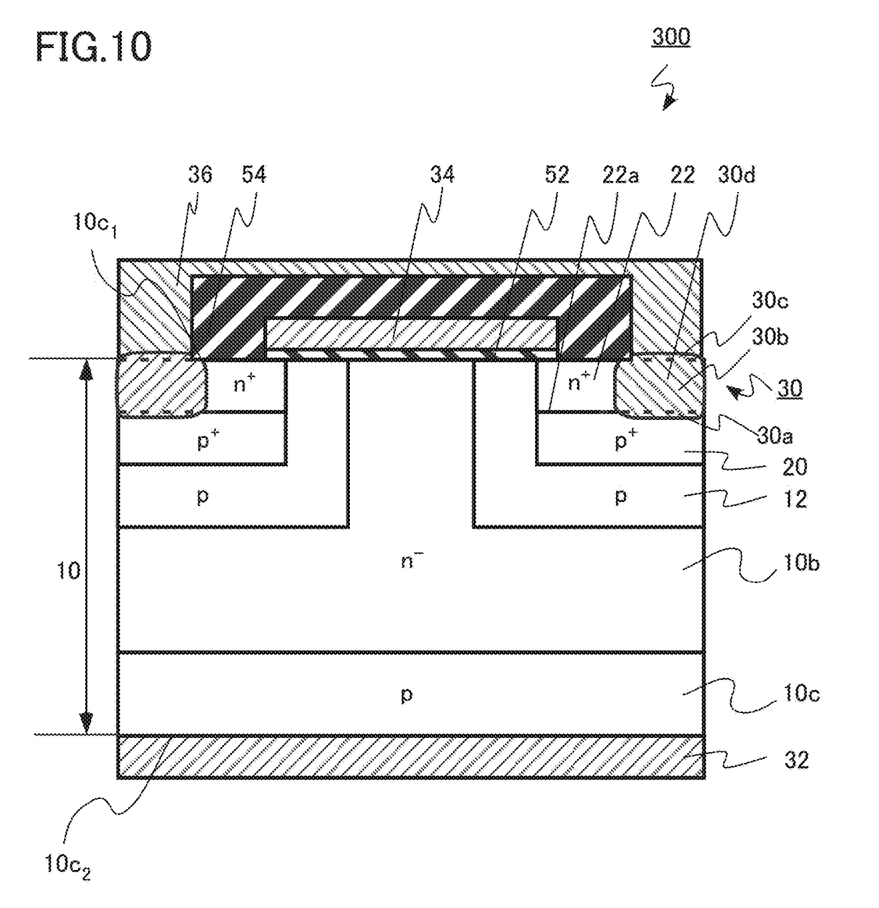
FIG. 10 is schematic cross-sectional diagram of a semiconductor device according to a third embodiment.

FIG. 10 is a schematic cross-sectional diagram illustrating the semiconductor device according to the embodiment.

In the semiconductor device 300 according to the embodiment, the fifth silicon carbide region 10c is a p$^+$-type silicon carbide layer. The fifth silicon carbide region 10c contains, for example, Al (aluminum) with an impurity concentration of $5\times10^{18}$ atoms/cm$^3$ or more and $5\times10^{18}$ atoms/cm$^3$ or less as p-type impurities. The fifth silicon carbide region 10c functions as a collector region of the semiconductor device 300. The semiconductor device 300 according to the embodiment is an IGBT.

The fourth electrode 30 functions as an emitter electrode. In addition, the second electrode 32 functions as a collector electrode.

In the semiconductor device according to the embodiment, it is possible to provide a semiconductor device including electrodes having low contact resistance.

While certain embodiments have been described, these embodiments have been presented by way of example only, and are not intended to limit the scope of the inventions. Indeed, semiconductor devices and methods of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall in the scope and spirit of the inventions.

What is claimed is:

1. A semiconductor device comprising:
    a first electrode;
    a second electrode;
    a third electrode provided between the first electrode and the second electrode;
    a first insulating film provided between the third electrode and the second electrode;
    a silicon carbide layer provided between the first insulating film and the second electrode;
    a first silicon carbide region provided between the third electrode and the second electrode, the first silicon carbide region being provided in the silicon carbide layer;
    a second silicon carbide region provided between the third electrode and the first silicon carbide region, the second silicon carbide region being provided in the silicon carbide layer;
    a third silicon carbide region provided between the third electrode and the second silicon carbide region, the third silicon carbide region being provided in the silicon carbide layer;
    a fourth silicon carbide region provided in the silicon carbide layer; and
    a fourth electrode provided between the first electrode and the fourth silicon carbide region,
       the fourth electrode being provided laterally adjacent to the third silicon carbide region,
       the fourth electrode containing a metal silicide, and
       a first distance between the first electrode and a first interface between the fourth electrode and the fourth silicon carbide region being longer than a second distance between the first insulating film and a second interface between the third silicon carbide region and the fourth silicon carbide region, and
       the fourth silicon carbide region provided between the third silicon carbide region and the second silicon carbide region in a direction perpendicular to the second interface.

2. The semiconductor device according to claim 1, wherein the metal silicide is a titanium silicide, an aluminum silicide, a nickel silicide, a cobalt silicide, a tantalum silicide, a tungsten silicide or a hafnium silicide.

3. The semiconductor device according to claim 1, wherein a thickness of the third silicon carbide region is 100 nm or less.

4. The semiconductor device according to claim 1, further comprising a second insulating film provided at a side of or above the first insulating film and the third electrode.

5. The semiconductor device according to claim 1, further comprising a first-conductivity-type fifth silicon carbide region provided in the silicon carbide layer between the first silicon carbide region and the second electrode.

6. The semiconductor device according to claim 1, further comprising a second-conductivity-type fifth silicon carbide region provided in the silicon carbide layer between the first silicon carbide region and the second electrode.

7. A method of manufacturing a semiconductor device, comprising:
    forming a second-conductivity-type first silicon carbide region by performing ion implantation of second-conductivity-type impurities on a first-conductivity-type second silicon carbide region provided in a silicon carbide layer having a first plane and a second plane provided opposite to the first plane, a portion of the second silicon carbide region being provided on the first plane;
    forming a second-conductivity-type third silicon carbide region by performing ion implantation of second-conductivity-type impurities on the first silicon carbide region;
    forming a first-conductivity-type fourth silicon carbide region by performing ion implantation of first-conductivity-type impurities on the first silicon carbide region, a third plane being formed between the fourth silicon carbide region and the third silicon carbide region;
    forming a metal layer containing a metal on the fourth silicon carbide region; and
    forming a first electrode by performing thermal treatment on the silicon carbide layer with the metal layer being formed, the first electrode being provided to include the first plane and the third plane within the first silicon carbide region, a thickness of the first electrode being larger than a distance between a portion of the first plane included in the first electrode and a portion of the third plane included in the first electrode, the first electrode containing a metal silicide.

8. The method according to claim 7, wherein, after forming the third silicon carbide region by performing ion implantation of second-conductivity-type impurities on the first silicon carbide region, forming the fourth silicon carbide region by performing ion implantation of first-conductivity-type impurities on the first silicon carbide region.

9. The method according to claim 7,
wherein, before performing ion implantation of second-conductivity-type impurities on the first silicon carbide region or before performing ion implantation of first-conductivity-type impurities on the first silicon carbide region, forming a mask on the first silicon carbide region,
forming the third silicon carbide region by performing ion implantation of second-conductivity-type impurities on the first silicon carbide region by using the mask, and
forming the fourth silicon carbide region by performing ion implantation of first-conductivity-type impurities on the first silicon carbide region by using the mask.

10. The method according to claim 7, wherein a ratio of the thickness of the metal layer and the thickness of the fourth silicon carbide region is 1 or more and 2 or less.

11. The method according to claim 7, wherein the thickness of the fourth silicon carbide region is 100 nm or less.

12. The method according to claim 7, wherein the thickness of the metal layer is 90 nm or more and 150 nm or less.

13. A semiconductor device comprising:
a silicon carbide layer having a first plane and a second plane provided opposite to the first plane;
an insulating film provided on the first plane;
a first electrode provided on the insulating film;
a second electrode provided on the second plane;
a first-conductivity-type first silicon carbide region provided in the silicon carbide layer, a portion of the first silicon carbide region being provided on the first plane;
a second-conductivity-type second silicon carbide region provided in the first silicon carbide region, a portion of the second silicon carbide region being provided on the first plane;
a first-conductivity-type third silicon carbide region provided in the second silicon carbide region, a portion of the third silicon carbide region being provided on the first plane;
a second-conductivity-type fourth silicon carbide region provided under the third silicon carbide region in the second silicon carbide region, a third plane being provided between the third silicon carbide region and the fourth silicon carbide region; and
a third electrode provided to include the first plane and the third plane in the second silicon carbide region, a thickness of the third electrode being larger than a distance between a portion of the first plane included in the third electrode and a portion of the third plane included in the third electrode, the third electrode containing a metal silicide.

14. The semiconductor device according to claim 13,
wherein the third electrode includes a first portion provided under the third plane and a second portion provided between the first plane and the third plane, and
a length of the first portion in a direction parallel to the first plane in a fourth plane perpendicular to the first plane is smaller than a length of the second portion in the direction parallel to the first plane in the fourth plane.

15. The semiconductor device according to claim 13, wherein the third electrode further includes a third portion provided above the first plane.

16. The semiconductor device according to claim 13, wherein the metal silicide is a titanium silicide, an aluminum silicide, a nickel silicide, a cobalt silicide, a tantalum silicide, a tungsten silicide, or a hafnium silicide.

\* \* \* \* \*